(12) United States Patent
Uebel et al.

(10) Patent No.: US 10,466,282 B2
(45) Date of Patent: Nov. 5, 2019

(54) SOLAR ENERGY METERING, COMMUNICATIONS, AND CONTROL SYSTEM

(71) Applicant: SunPower Corporation, San Jose, CA (US)

(72) Inventors: Udo Uebel, San Francisco, CA (US); Gaurang Kavaiya, Concord, CA (US); Kevin Fischer, Orinda, CA (US); Carl Lenox, San Rafael, CA (US); Donald Scrutchfield, Austin, TX (US)

(73) Assignee: SUNPOWER CORPORATION, San Jose, CA (US)

( * ) Notice: Subject to any disclaimer, the term of this patent is extended or adjusted under 35 U.S.C. 154(b) by 402 days.

(21) Appl. No.: 14/810,423

(22) Filed: Jul. 27, 2015

(65) Prior Publication Data

US 2017/0030950 A1   Feb. 2, 2017

(51) Int. Cl.
*G01R 21/00* (2006.01)
*G01R 21/06* (2006.01)
(Continued)

(52) U.S. Cl.
CPC .......... *G01R 21/007* (2013.01); *G01R 21/06* (2013.01); *G01R 22/00* (2013.01); *G01R 22/06* (2013.01);
(Continued)

(58) Field of Classification Search
CPC .................................................. G01R 21/007
(Continued)

(56) References Cited

U.S. PATENT DOCUMENTS

| 5,210,785 A | 5/1993 | Sato et al. |
| 8,774,007 B2 * | 7/2014 | Hussain ............. H02J 13/0024 370/241 |

(Continued)

FOREIGN PATENT DOCUMENTS

| CN | 203 858 746 U | 10/2014 |
| JP | 2000-284006 A | 10/2000 |

(Continued)

OTHER PUBLICATIONS

Notification of Transmittal of the International Search Report and the Written Opinion of the International Searching Authority, or the Declaration for International Application No. PCT/US2016/042103 (dated Oct. 18, 2016).

(Continued)

*Primary Examiner* — Ricky Ngon
(74) *Attorney, Agent, or Firm* — Jenkins, Wilson, Taylor & Hunt, P.A.

(57) ABSTRACT

Methods, systems, and computer readable media are disclosed for monitoring photovoltaic solar systems. In some examples, the system includes a solar power measurement input for coupling to a solar panel system, a measurement circuit configured to measure power produced by the solar panel system using the solar power measurement input, and a data transmission system. The measurement circuit is configured, by virtue of the measurement circuit including electrical components rated to at least a certain tolerance level, to take revenue-grade power measurements from the solar power measurement input with a level of accuracy that meets a national or international metering standard. The data transmission system is configured to transmit the revenue-grade power measurements from the measurement circuit to a remote system.

16 Claims, 5 Drawing Sheets

(51) Int. Cl.
  *G01R 22/00* (2006.01)
  *G05F 1/66* (2006.01)
  *G06Q 50/06* (2012.01)
  *H02J 3/06* (2006.01)
  *H02J 13/00* (2006.01)
  *H02J 3/38* (2006.01)
  *H04L 12/28* (2006.01)
  *G01R 22/06* (2006.01)
  *H02J 3/00* (2006.01)

(52) U.S. Cl.
  CPC ............ *G01R 22/063* (2013.01); *G05F 1/66* (2013.01); *G06Q 50/06* (2013.01); *H02J 3/06* (2013.01); *H02J 3/383* (2013.01); *H02J 13/0013* (2013.01); *H02J 13/0079* (2013.01); *H04L 12/2825* (2013.01); *H02J 2003/003* (2013.01); *Y02B 70/325* (2013.01); *Y02E 10/563* (2013.01); *Y02E 40/72* (2013.01); *Y04S 10/123* (2013.01); *Y04S 20/228* (2013.01)

(58) Field of Classification Search
  USPC .......................................................... 702/62
  See application file for complete search history.

(56) References Cited

U.S. PATENT DOCUMENTS

| | | | |
|---|---|---|---|
| 9,020,653 B2 | 4/2015 | Lenox | |
| 9,515,602 B2* | 12/2016 | Thompson | H02S 50/10 |
| 2008/0147335 A1* | 6/2008 | Adest | G01D 4/004 |
| | | | 702/64 |
| 2009/0012917 A1* | 1/2009 | Thompson | G06Q 50/06 |
| | | | 705/412 |
| 2010/0071744 A1 | 3/2010 | Peurach et al. | |
| 2010/0082171 A1* | 4/2010 | Takehara | H04L 41/0659 |
| | | | 700/286 |
| 2010/0241375 A1* | 9/2010 | Kumar | H01L 31/02021 |
| | | | 702/62 |
| 2011/0084551 A1 | 4/2011 | Johnson et al. | |
| 2013/0049710 A1 | 2/2013 | Kraft et al. | |
| 2013/0090935 A1* | 4/2013 | Uselton | G06Q 50/06 |
| | | | 705/1.1 |
| 2013/0190939 A1 | 7/2013 | Lenox | |
| 2013/0249291 A1 | 9/2013 | Pan et al. | |
| 2013/0249297 A1 | 9/2013 | Takehara et al. | |
| 2015/0145550 A1 | 5/2015 | Thompson | |

FOREIGN PATENT DOCUMENTS

| | | |
|---|---|---|
| JP | 2006-317355 A | 11/2006 |
| JP | 2009-531000 A | 8/2009 |
| JP | 2010-283936 A | 12/2010 |
| JP | 2013-250094 A | 12/2013 |
| JP | 2014-032152 A | 2/2014 |
| JP | 2014-039356 A | 2/2014 |
| JP | 2014-059244 A | 4/2014 |
| JP | 2014-215654 A | 11/2014 |
| JP | 2014-232770 A | 12/2014 |
| JP | 2015-031631 A | 2/2015 |
| JP | 2015-136233 A | 7/2015 |

OTHER PUBLICATIONS

Communication of European publication number and information on the application of Article 67(3) EPC for European Patent Application Serial No. 16831023.3 (dated May 9, 2018).

Communication of the Extended European Search Report for European Patent Application Serial No. 16831023.3 (dated Jun. 27, 2018).

Office Action for Japanese Patent Application Serial No. 2017-552054 (dated Dec. 4, 2018).

Final Office Aciton for Japanese Patent Application Serial No. 2017-552054 (dated Jul. 30, 2019).

Office Action for Chinese Patent Application Serial No. 201680025880.5 (dated Jun. 20, 2019).

* cited by examiner

SOLAR ENERGY METERING, COMMUNICATIONS, AND CONTROL SYSTEM

BACKGROUND

The subject matter described in this specification relates generally to monitoring photovoltaic solar systems.

Photovoltaic cells, commonly known as solar cells, are devices for conversion of solar radiation into electric energy. A solar panel system typically includes a panel of multiple photovoltaic cells on a frame, one or more inverters, and interconnection wiring. A solar panel system can also include other optional components such as batteries, solar trackers, and a meteorological station. The frame can be mounted on top of a building and the other components can be located on the outside or inside of the building to interface with an electric grid of the building and, in some cases, a utility electric grid. Some solar panel systems include a solar energy metering, communications, and control system that includes a central processing unit for, e.g., interfacing with net and sub meters, inverters, and other optional components.

SUMMARY

A photovoltaic supervisor system can be configured for consumption metering and revenue-grade production metering. The system can provide high availability transmission of metering data to a remote system by virtue of multiple data communications technologies.

In some examples, the system includes a solar power measurement input for coupling to a solar panel system; a measurement circuit configured to measure power produced by the solar panel system using the solar power measurement input, wherein the measurement circuit is configured, by virtue of the measurement circuit comprising a plurality of electrical components rated to at least a certain tolerance level, to take a plurality of revenue-grade power measurements from the solar power measurement input with a level of accuracy that meets a national or international metering standard; and a data transmission system configured to transmit the revenue-grade power measurements from the measurement circuit to a remote system.

In some examples, the system includes a solar power measurement input for coupling to a solar panel system; a measurement circuit configured to take a plurality of power measurements from the solar power measurement input; and a data communication system configured to transmit the power measurements from the measurement circuit to a remote system, wherein the data communication system comprises a first transmitter configured to transmit on a first protocol and a second transmitter configured to transmit on a second protocol different from the first protocol, and wherein the data communication system is configured to transmit the power measurements on the first transmitter and, in response to detecting unavailability of the first transmitter, switch from transmitting the power measurements on the first transmitter to transmitting the power measurements on the second transmitter.

The subject matter described in this specification may be implemented in hardware, software, firmware, or combinations of hardware, software and/or firmware. In some examples, the subject matter described in this specification may be implemented using a non-transitory computer readable medium storing computer executable instructions that when executed by one or more processors of a computer cause the computer to perform operations.

Computer readable media suitable for implementing the subject matter described in this specification include non-transitory computer-readable media, such as disk memory devices, chip memory devices, programmable logic devices, random access memory (RAM), read only memory (ROM), optical read/write memory, cache memory, magnetic read/write memory, flash memory, and application specific integrated circuits. In addition, a computer readable medium that implements the subject matter described in this specification may be located on a single device or computing platform or may be distributed across multiple devices or computing platforms.

DETAILED DESCRIPTION

Figure 1:
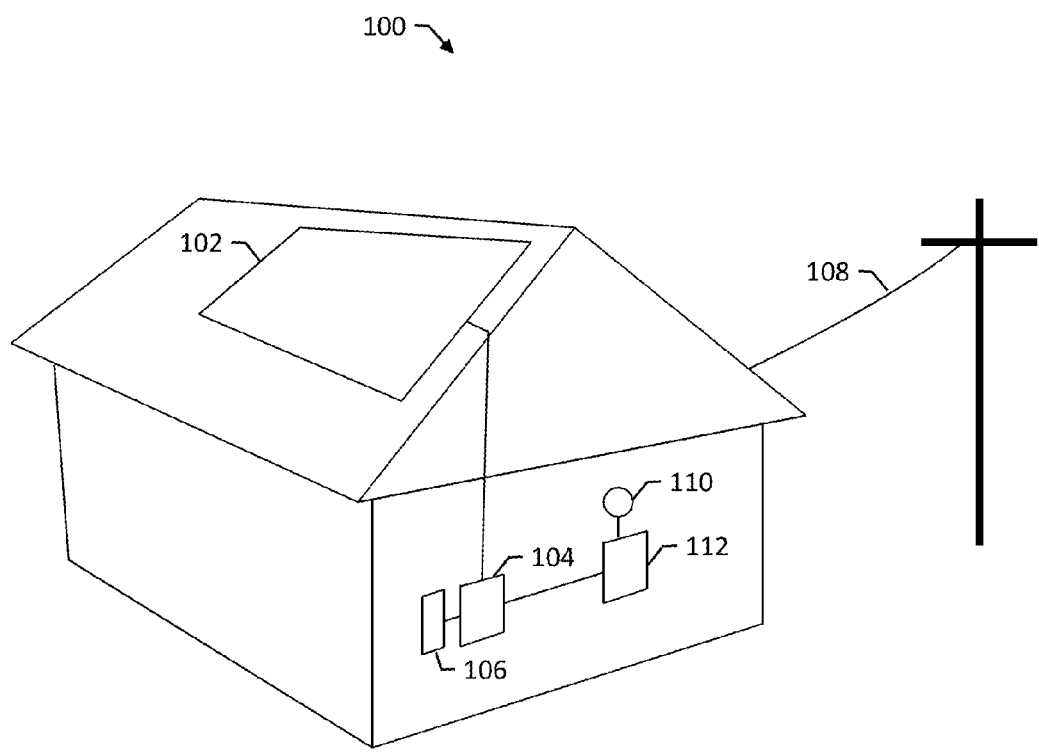
FIG. 1 is a diagram of an example electric system.

FIG. 1 is a diagram of an example electric system 100. The electric system 100 includes a solar panel system 102 including one or more photovoltaic solar panels, one or more inverters 104 coupled to the solar panel system 102, and a photovoltaic supervisor system 106. The electric system 100 also includes a connection 108 to a utility grid, an electric meter 110 for the connection 108 to the utility grid, and an electric panel 112 for the electric system 100.

When the sun is shining on the solar panel system 102, the solar panel system 102 produces direct current (DC) electric power and provides the DC power to the inverters 104. In response, the inverters 104 produce alternating current (AC) power for consumption by loads on the electric system 100 or for providing to the connection 108 to the utility grid. When the loads on the electric system 100 consume more power than is provided by the solar panel system 102, the loads draw power from the connection 108 to the utility grid. When loads consume less power than is provided by the solar panel system 102, the solar panel system 102 can provide the excess power to the connection 108 to the utility grid. Although FIG. 1 illustrates a grid-tied electric system 100, the systems and methods described in this specification can be applied in various other types of electric systems.

The photovoltaic supervisor system 106 is a computing system configured, by virtue of appropriate programming, to monitor the solar panel system 102 and perform one or more actions based on monitoring the solar panel system 102. For example, the photovoltaic supervisor system 106 can be configured for interfacing with net and sub meters, inverters, and other optional components of the system. In some examples, the photovoltaic supervisor system 106 measures power output by the solar panel system 102 and transmits measurements to a remote system, e.g., a homeowner's computer system, a building manager's computer system, or a solar panel manufacturer or installer computer system. In some examples, the photovoltaic supervisor system 106 does not directly monitor the solar panel system 102; instead, the photovoltaic supervisor system 106 can monitor or meter the inverters coupled to the solar panel system 102. The photovoltaic supervisor system 106 can be enclosed in a weatherproof housing for outdoor installation.

In some energy finance models, e.g., as specified in some kinds of power purchase agreements (PPAs), the power production by the solar panel system 102 is specified for measurement to a certain level of accuracy to determine energy billing. A PPA is a contract between a power purchaser and a power provider and is typically subject to regulation. In various solar panel systems, the power provider is the solar panel system owner and the power purchaser is a home or business owner.

Utility companies can bill customers based on net power usage. Utility companies typically provide their own meters that measure total electrical power that is used by the customer, and those meters can be used to establish the billable charges to the customer. Those meters typically are designed to meet a metering standard, e.g., a national or international metering standard, to take revenue-grade energy measurements. In some examples, a specification for metering accuracy originates from a financer of a PPA. A revenue-grade energy measurement is a measurement made using equipment that meets a metering standard so that the measurement is accurate to a level of accuracy specified by the metering standard. Revenue-grade energy measurements can be used to support financial charges and/or purchase or sale cost transactions of electric power.

To measure supplemental or additional electrical energy generation, additional meters may be used that provide measurement capability at various connection points of the customer's electrical installation. To avoid the inclusion of additional meters, the photovoltaic supervisor system 106 can be configured to include an integrated measurement circuit for revenue-grade energy measurements. The measurement circuit can be used for various other functions of the photovoltaic supervisor system 106 in addition to taking revenue-grade measurements for billing purposes. The measurement circuit can be integrated into the photovoltaic supervisor system 106 or provided as a modular unit that inserts into and becomes part of the photovoltaic supervisor system 106 for some installations.

To enable measurement accuracy that meets a metering standard typically involves additional of separate equipment, additional electric installation, and routing and management of communication data. The costs of such added equipment can be significant and can contribute to overhead and installation costs, which may be passed on to the customer. Integrating a revenue-grade measurement circuit into the photovoltaic supervisor system 106 can provide significant cost savings to the total installation to the customer.

The photovoltaic supervisor system can include a data communication system configured to transmit the energy measurements from the measurement circuit to a remote system. The remote system can be, e.g., a homeowner's computer system, a server system providing cloud services over the Internet, or a remote system of a utility company. The data communication system can be configured to handle various failover scenarios by switching from transmitting from one type of transmitter or protocol to a different type. By including circuits for different types of data communication technologies, the data communication system can switch between the different types of data communication automatically, as appropriate, and alter the amount and frequency of data transmitted dependent on the type of connection to improve availability of data communications.

Figure 2:
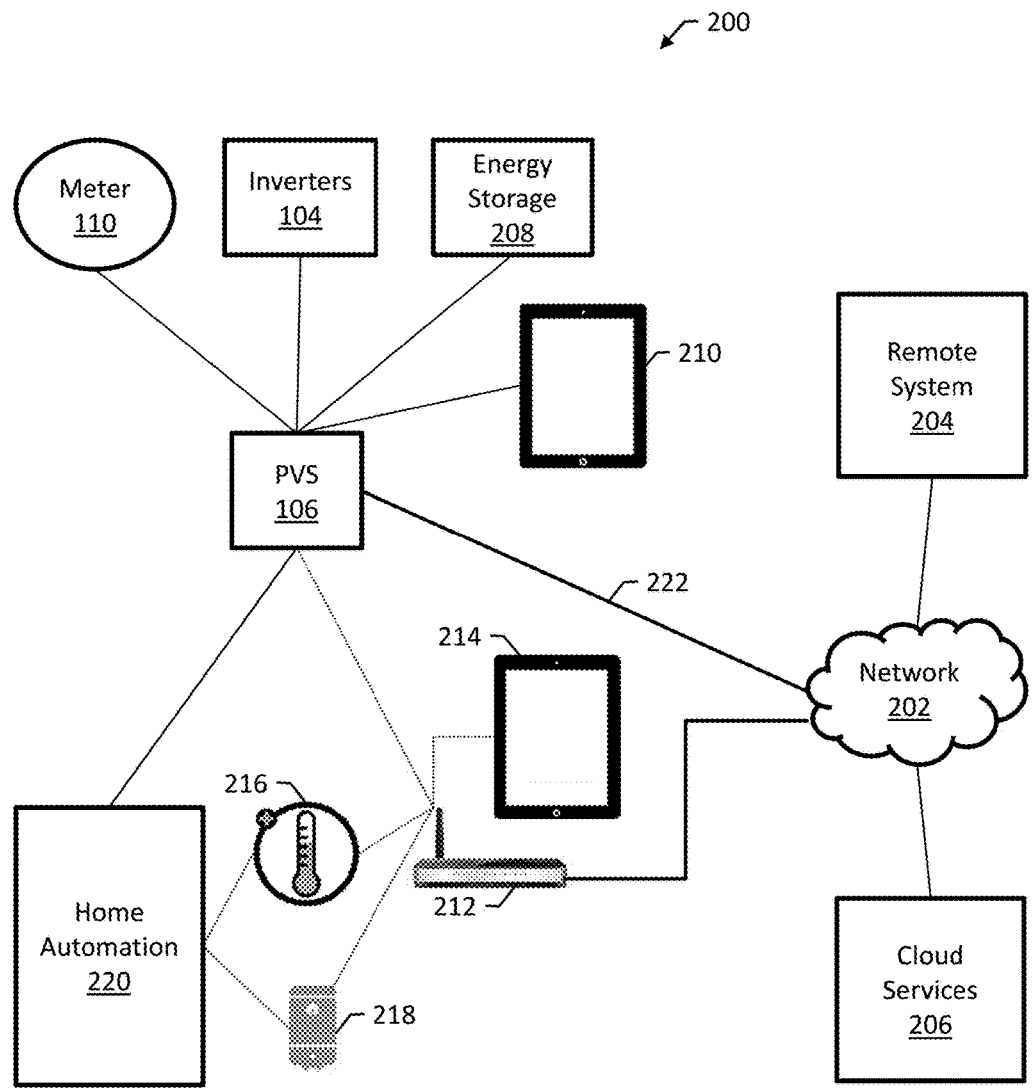
FIG. 2 is a block diagram of an example environment for a photovoltaic supervisor system.

FIG. 2 is a block diagram of an example environment 200 for the photovoltaic supervisor system 106. The photovoltaic supervisor system 106 communicates over a data communications network 202, e.g., the Internet, with a remote system 204 executing on a system of one or more computers and/or one or more computer servers providing cloud computing services 206 related to energy monitoring and management.

The photovoltaic supervisor system 106 communicates, either directly or over a data communications network, with one or more optional components of the system, including a consumption meter 110, which can be a smart meter; one or more inverters 104, which can include microinverters and/or string inverters that are each configured to couple to a string of solar cells; an energy storage device 208, e.g., one or more batteries and a control system of one or more computers; a commissioning device 210, e.g., a tablet computer or other appropriate computing device used to verify properties of a solar system after installation; and a wireless access point 212 for accessing, e.g., a local area network (LAN).

The photovoltaic supervisor system 106 can communicate, using the wireless access point 212, with a customer device 214 such as a tablet computer; the remote system 204 and the cloud services 206 using the network 202; a smart thermostat 216; one or more controllable electric loads 218; and a home automation system 220. The home automation system 220 can include one or more computers providing one or more services such a personal safety applications and appliance control applications.

In operation, the photovoltaic supervisor system 106 can take energy measurements and transmit the energy measurements to the remote system 204. The photovoltaic supervisor system 106 can transmit the energy measurements to other systems, e.g., the cloud services server 206, which can be configured to provide computing services for, e.g., home automation. In some examples, the remote system 204 and/or the cloud services server 206 can be configured for remote configuration modification and troubleshooting of the photovoltaic supervisor system 106, e.g., using a cloud-hosted web application.

Some applications depend on the energy measurements from the photovoltaic supervisor system 106. For those applications, it can be useful for the photovoltaic supervisor system 106 to be able to communicate on multiple communication channels. For example, the photovoltaic supervisor system 106 can be configured to transmit energy measurements to the remote system 204. The photovoltaic supervisor system 106, in normal operation, transmits the measurements to the wireless access point 212, which routes the measurements to the remote system 204.

When the photovoltaic supervisor system 106 determines that the wireless access point 212 is not available, e.g., due to malfunction, the photovoltaic supervisor system 106 can switch from transmitting to the wireless access point 212 to transmitting over a cellular network 222. When the photovoltaic supervisor system 106 determines that the cellular network 222 is not available, e.g., due to malfunction, the photovoltaic supervisor 106 can switch from transmitting on the cellular network 222 to another communications channel or protocol, e.g., a power line communications channel.

Various failover scenarios are possible. In general, the photovoltaic supervisor system 106 is configured to communicate using more than one communications channel and to switch between channels in response to determining that a channel is not available for communication. In some examples, the photovoltaic supervisor system 106 can determine that a channel is not available when an expected acknowledgement message is not received, or when a device, e.g., wireless access point 212, sends a message indicating that it is not available for communication.

Figure 3:
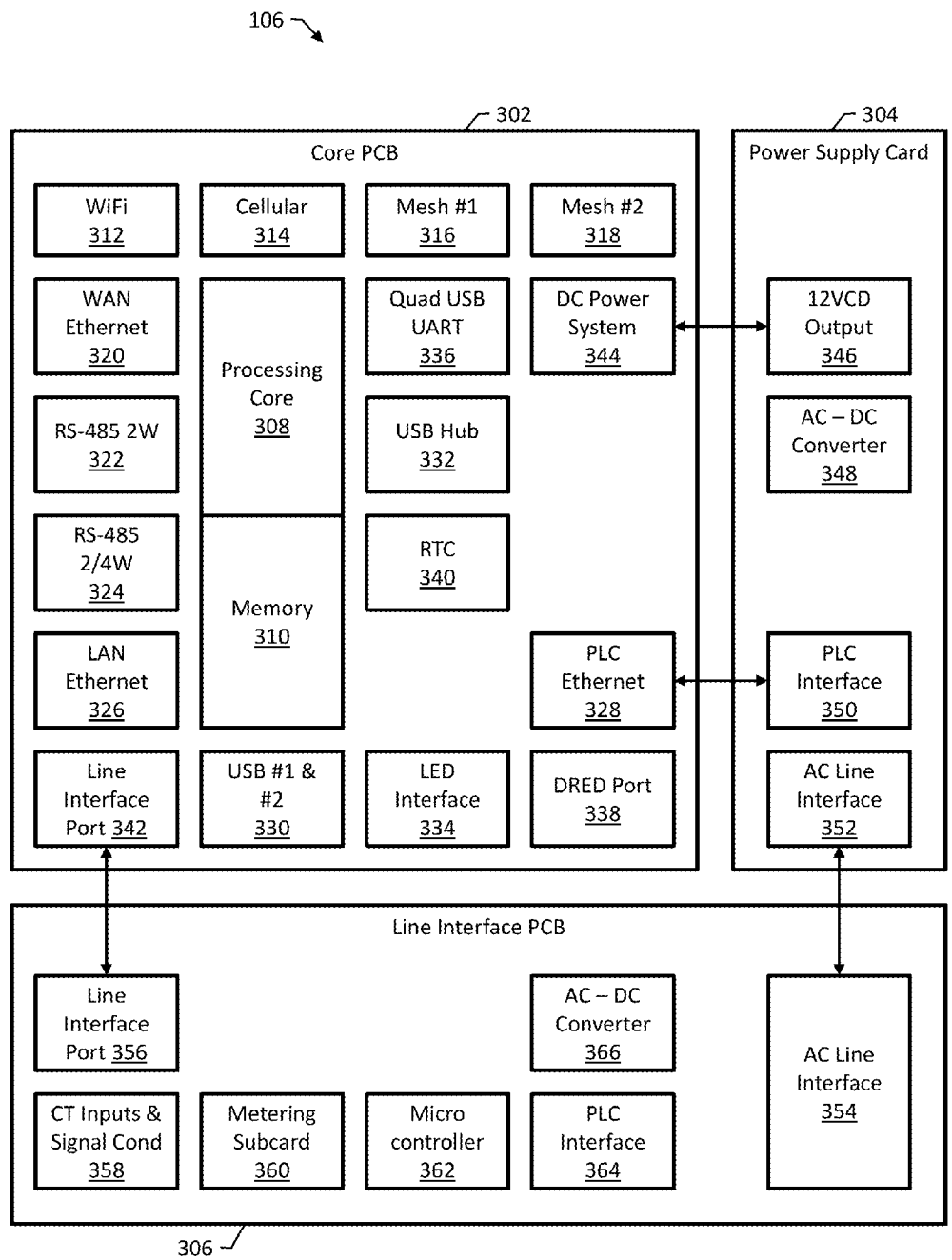
FIG. 3 is a block diagram of an example photovoltaic supervisor system.

FIG. 3 is a block diagram of an example photovoltaic supervisor system 106. The system 106 is illustrated as being implemented by electric components on three separate physical structures for purposes of illustration. The system 106 can be implemented using any appropriate combination of one or more circuit structures, e.g., printed circuit boards (PCBs) and other types of cards.

The system 106 includes a core PCB 302, a power supply card 304, and a line interface PCB 306 (e.g., an AC line interface). The core PCB 302 includes a processing core 308 and memory 310. The processing core can be one or more processors configured to execute, e.g., a LINUX kernel. The memory 310 can include, e.g., flash storage and dynamic random access memory. In operation, the processing core 308 executes software to cause the system 106 to perform various functions, e.g., taking measurements, transmitting measurements, switching communication channels in response to detecting lack of availability of communication channels, and executing control algorithms for other components.

The system 106 includes a data communication system that includes wireless communication radios and wired communication circuits. As illustrated, the system 106 includes, for wireless communication: a WiFi radio 312, e.g., an 802.11n WiFi radio; a cellular radio 314, e.g., a 3G/4G/LTE radio; and two separate mesh network radios 316 and 318, e.g., Zigbee radios for direct communications with smart meters and/or home automation devices. The system 106 includes, for wired communication: a wide area network (WAN) Ethernet port (320); an RS-485 2 wire port 322; an RS-485 2/4 wire port 324; a LAN Ethernet port 326; and a power line communication (PLC) Ethernet port 328.

The core PCB 302 can include various other interfaces, e.g., first and second universal serial bus (USB) ports 330 and a USB hub 332 for expansion capabilities; a light emitting diode (LED) interface 334 for status indicators on an external enclosure or on-board LED indicators for an indoor enclosure; a quad USB universal asynchronous receiver/transmitter (UART) port 336, e.g., for supporting communication with the me interface PCB 306; and multi-purpose digital I/O connector 338 for grid control interface devices such as the demand response enabling device (DRED) interface, used in Australia, and Ripple Control, used in Germany, for receiving control signals from a utility. The core PCB 302 can include a real-time counter (RTC) 340, an electrically isolated line interface port 342 for connecting to the line interface PCB 306, and a DC power system interface 344 for connecting to the power supply card 304.

The core PCB 302 can be implemented using various custom or off-the-shelf communication components. For example, the core PCB 302 can be implemented using a wireless router processor. Such a processor can include a built-in 802.11n wireless radio and multiple Ethernet ports for LAN and WAN. To implement the PLC Ethernet 328, the core PCB 302 include a chipset for HOMEPLUG AV compatible networking over AC power lines. The cellular radio 314 can be implemented using a MiniPCI (USB) based internal, replaceable cellular communications card, suitable for domestic and foreign radio networks. The serial communications ports The power supply card 304 is configured to supply power to the system 106 and includes a low voltage, e.g., 12 V DC, output 346, an AC-DC converter 348, a PLC interface 350, and an AC line interface 352. The line interface PCB 306 is configured to electrically couple to a solar panel system for metering and includes an AC line interface 354 for coupling to the power supply card 304 and an AC line interface port 356 for coupling to the core PCB 302. The line interface PCB 306 also includes one or more measurement inputs 358 for coupling to, e.g., current transformers (CTs) for taking energy measurements. The measurement inputs 358 can include one or more signal conditioning circuits.

The line interface PCB 306 includes a metering subcard or metering circuit subsection 306 for taking energy measurements and a microcontroller 362 for, e.g., controlling the operation of the line interface PCB 306 and the measurement functions of measuring and sending measurements to the core PCB 302 for transmission. The line interface PCB 306 includes an AC-DC converter 366 and a PLC interface 364 that is separate from the PLC interface 350 used by the power supply card 304.

In operation, the line interface PCB 306 provides a single point of installation for AC connectivity and for integrating PLC communications, e.g., microinverter PLC communications and networking/communication features of the core PCB 302. In some examples, the line interface PCB 306 supports various electric system installations, e.g., U.S. residential 120V, 208/240V split phase installations; provides safety isolation (SELV) between high voltage AC connections and low voltage (consumer electronics interconnections) from the core PCB 302; can include integrated AC line protection circuits, including fusing, varistors (e.g., metal-oxide varistors), and gas discharge tubes (GDTs), and provides AC voltage surge and transient protection; provides firmware processing of communications data to/from microinverters and data interchange to/from system software executing on the core PCB 302.

The line interface PCB 306 can be configured for integrating at or better than 0.2% accuracy revenue-grade metering. For example, the line interface PCB 306 can be configured for revenue-grade metering by virtue of selecting electrical components rated to at least a certain tolerance level in critical components in the critical path of signal flow, e.g., the CT inputs 358 and the metering subcard 360. In general, the line interface PCB 306 performs metering using a voltage measurement circuit and a current measurement circuit. The voltage measurement circuit can include one or more scaling networks configured, by virtue of one or more resistors and one or more buffering amplifiers, to translate a line voltage from a measurement input to a signal at a lower voltage than the line voltage. The current measurement circuit comprises one or more current transformers configured to provide low level voltages to measurement electronics that result from current that flows through one or more power carrying conductors.

In some examples, the system 106 includes one or more consumption inputs for connecting to, e.g., a utility line, and the line interface PCB 306 can be configured to take consumption measurements from the consumption inputs for transmission using the data communication system on the core PCB 302. For example, the metering subcard 360 can include a three-channel input for three phase metering; the three channels can alternatively be split so that one channel is used for consumption metering and two channels are used for production metering. In some examples, two channels are used for consumption metering and one channel is used for production metering. Using the line interface PCB 306 for both energy production and energy consumption measurements can reduce the overall cost of the system by removing the need for redundant components. The consumption measurements are not typically revenue-grade; however, the line interface PCB 306 can be configured to take revenue-grade measurements for both production and consumption.

In some examples, the power supply card 304 is configured for a 100-250 V AC input range for worldwide operation. The power supply card 304 can output low voltage, e.g., 12 V DC for the core PCB 302, e.g., the main bus voltage of the core PCB 302. The power supply card 304 can include integrated AC line protection circuits, including fusing, varistors (e.g., metal-oxide varistors), and gas discharge tubes (GDTs). In some examples, the AC line protection circuits are also included in the line interface PCB 306, and the use of those AC line protection circuits can significantly benefit the integration of metering functionality. The power supply card 304 can include integrated PLC coupling transformers and a zero crossing detector circuit.

The system 106 can be configured, by virtue of the various data communication components, to communicate in a variety of different scenarios. For example, the system 106 can be configured to connect to three separate Zigbee networks running different protocols using the two mesh network radios 316 and 318, or two separate Zigbee networks running different protocols and one other network utilizing an 802.15.4 physical layer, e.g., a network using IPv6 over low power wireless personal area networks (6LoWPAN) or THREAD. For example, such connections can enable lost cost consumption (net) metering by connecting to a smart meter over a Zigbee SEP 1.X or 2.0 network while simultaneously communicating within a Zigbee home automation network and a Zigbee network with a proprietary protocol communicating with an inverter. Alternatively, the system 106 can connect with a smart meter with a home automation network utilizing THREAD. In some examples, the system 106 optionally includes one or more 802.15.4 radios.

In some examples, the system 106 can connect to a LAN using WiFi while simultaneously acting as a WiFi access point to allow a user device to connect to allow configuration. For example, the system 106 can serve as a local human-machine interface (HMI) over direct connection to the system's internet protocol (IP) address.

The system 106 can be configured to switch between LAN and WAN connections and other connections, automatically, as appropriate, and the system 106 can alter the amount and frequency of data transmitted depending on the type of connection. The system 106 can be configured to connect to inverters and other power electronic devices using the RS-485 physical layer and proprietary protocols, e.g., Modbus RTU or Modbus TCP. Since the core PCB 302 can include two RS-485 ports 322 and 324, the system 106 can support two such connections simultaneously which may use different protocols.

The system 106 can be configured to connect to microinverters using, e.g., the PLC interface 364. In some examples, the line interface PCB 306 is separable from the core PCB 302, which means that the line interface PCB 306 may be substituted to allow for other devices that communicate in a similar fashion. The system 106 can push firmware upgrades to devices, e.g., inverters.

Figure 4:
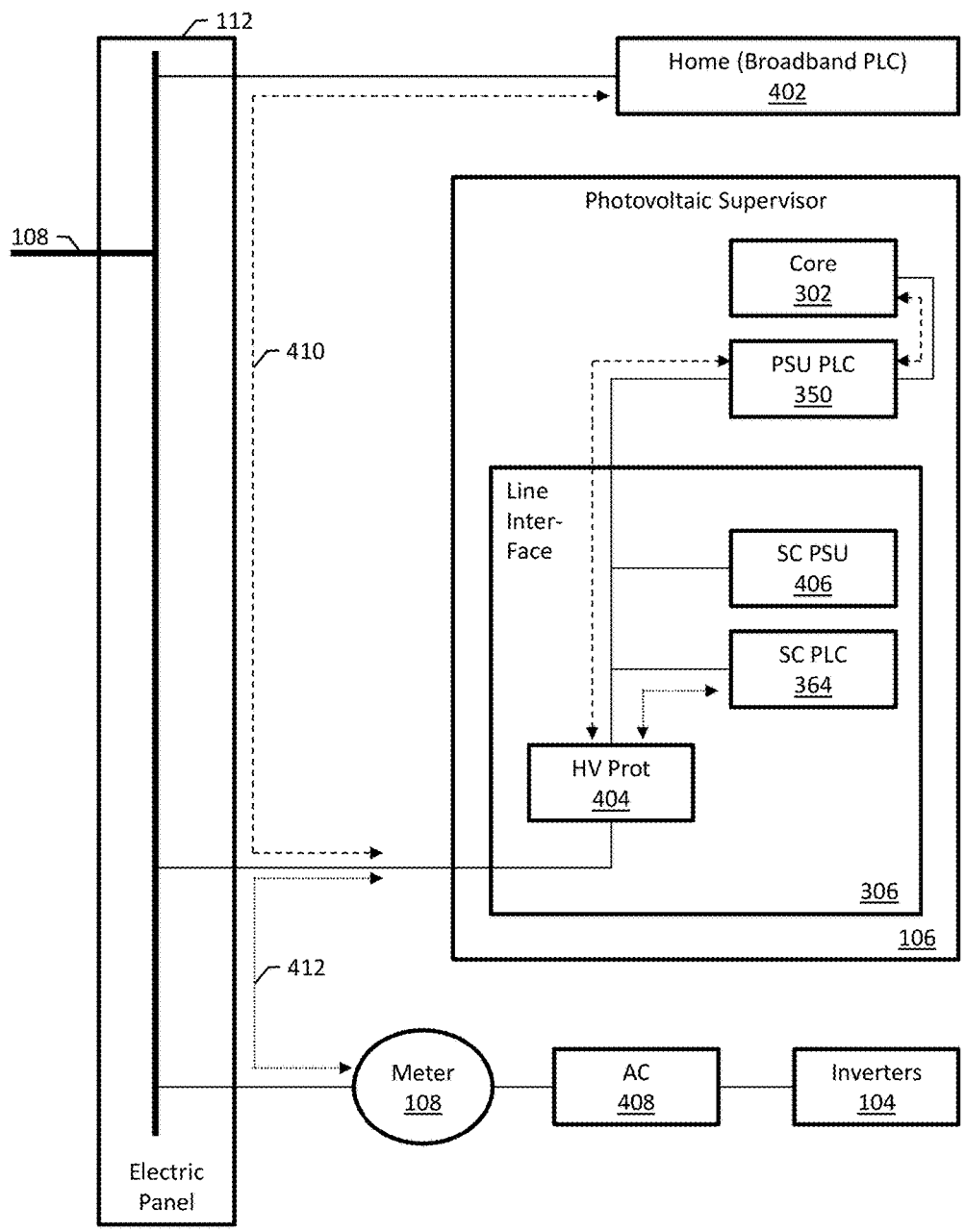
FIG. 4 is a block diagram illustrating two power line communication networks that operate within the same electrical system.

FIG. 4 is a block diagram illustrating two power line communication networks that operate within the same electrical system. The core PCB 302 uses a first PLC network 410, which can be, e.g., a HOMEPLUG communication network. The core PCB 302 can communicate with a broadband home network 402 at, e.g., 2-30 MHz, through a high voltage protection circuit 404. The line interface PCB 306 uses a second PLC network 412, which can be, e.g., an alternating current photovoltaic (ACPV) communication network, using a PLC line interface unit 364. The line interface PCB 306 can communicate with the inverters 104 at, e.g., low bandwidth PLC, through an optional meter 108 and an optional AC combine/disconnect circuit 408. The system 106 can perform filtering and isolation for mutual compatibility.

Figure 5:
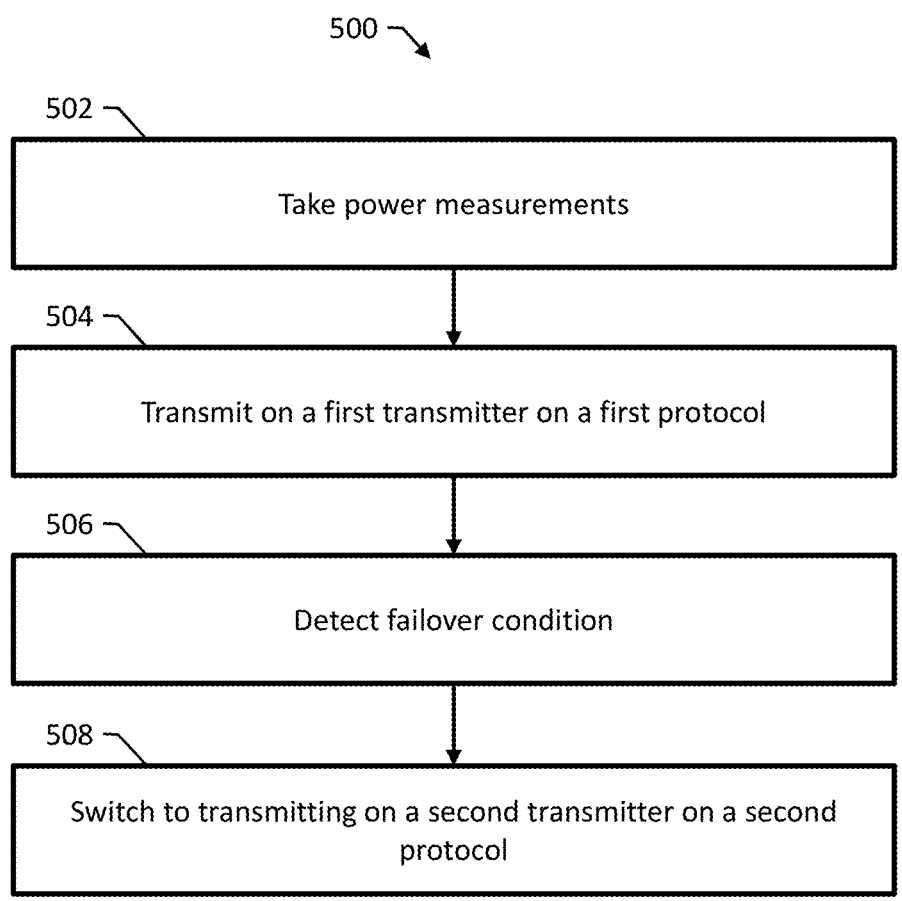
FIG. 5 is a flow diagram of an example method for high availability communication by a photovoltaic supervisor system.

FIG. 5 is a flow diagram of an example method 500 for high availability communication by a photovoltaic supervisor system 106. The method 500 can be performed by a system of one or more computers, e.g., the processing core 308 illustrated in FIG. 3.

The system takes one or more power measurements of power produced by a solar panel system and/or power consumed by one or more electric loads (502). The measurements can be, e.g., measurements of voltage and/or current taken in a series over time. The measurements can be integrated over time to determine an amount of energy produced or consumed.

The system transmits the measurements on a first transmitter on a first protocol to a remote system (504). For example, the system can transmit the measurements to a LAN using a WiFi access point. Before transmitting, the system can establish a connection with the remote system, e.g., so that the remote system can associate the measurements with a customer account.

The system detects a failover condition (506). For example, the system can determine that an acknowledgement message has not been received, or that the transmitter has set an error flag or otherwise sent a message indicating that the transmitter is not available. The transmitter may not be available due to a malfunction or due to environmental changes.

The system switches to transmitting on a second transmitter on a second protocol (508). For example, the system can switch to transmitting on a cellular network, a mesh network, or a PLC network. If any of those networks become unavailable, the system can switch back to the first transmitter or switch to yet another transmitter. The ability to switch between different types of communications technologies can improve connection reliability and connectivity, which can be useful to enable the cost-effective management and dispatch of highly distributed energy assets such as solar panel systems, energy storage, and controllable loads.

Although specific examples and features have been described above, these examples and features are not intended to limit the scope of the present disclosure, even where only a single example is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed in this specification (either explicitly or implicitly), or any generalization of features disclosed, whether or not such features or generalizations mitigate any or all of the problems described in this specification. Accordingly, new claims may be formulated during prosecution of this application (or an application claiming priority to this application) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system comprising:
a solar power measurement input for coupling to a solar panel system;
a measurement circuit configured to take a plurality of power measurements from the solar power measurement input; and
a data communication system configured to transmit the power measurements from the measurement circuit to a remote system, wherein the data communication system comprises a first transmitter configured to transmit on a first protocol and a second transmitter configured to transmit on a second protocol different from the first protocol, and wherein the data communication system is configured to transmit the power measurements on the first transmitter and, in response to detecting unavailability of the first transmitter, switch from transmitting the power measurements on the first transmitter to transmitting the power measurements on the second transmitter;
wherein the data communication system is configured, by virtue of the data communication system comprising two separate power line communication devices, to simultaneously communicate with a broadband home power line network and a low bandwidth inverter power line network, including transmitting the power measurements on the broadband home power line network with a first power line communications device and transmitting the power measurements on the low bandwidth inverter power line network with a second power line communications device.

2. The system of claim 1, wherein the first transmitter is configured to transmit over a WiFi network and the second transmitter is configured to transmit over a cellular network.

3. The system of claim 1, wherein the first transmitter is configured to transmit over a wireless communications link and the second transmitter is configured to transmit over a wired communications link.

4. The system of claim 1, wherein the data communication system is configured to adjust the amount of data transmitted or the frequency of transmission or both based on whether the first transmitter is transmitting or the second transmitter is transmitting.

5. The system of claim 1, comprising a control circuit configured to perform closed or open loop control of one or more devices connected by the data communication system.

6. The system of claim 1, comprising one or more consumption inputs for connecting to a utility line, wherein the measurement circuit is configured to take a plurality of consumption measurements from the consumption inputs and the data communication system is configured to transmit the consumption measurements to the remote system or a different remote system.

7. The system of claim 1, wherein the data communication system is configured, by virtue of a wireless or wired connection to a networking device, to connect to a local area network and to act as a wireless access point to the local area network.

8. The system of claim 1, wherein the data communication system is configured, by virtue of the data communication system comprising two separate wireless mesh network radios, to simultaneously communicate with a smart meter, a home automation network, and an inverter control system.

9. A method comprising:
taking, by a measurement circuit, a plurality of power measurements from a solar power measurement input coupled to a solar panel system; and
transmitting, by a data communication system, the power measurements from the measurement circuit to a remote system, wherein transmitting the power measurements comprises transmitting, by a first transmitter, on a first protocol and transmitting, by a second transmitter, on a second protocol different from the first protocol, and wherein transmitting the power measurements comprises transmitting the power measurements on the first transmitter and, in response to detecting unavailability of the first transmitter, switch from transmitting the power measurements on the first transmitter to transmitting the power measurements on the second transmitter;
simultaneously communicating, by virtue of the data communication system comprising two separate power line communication devices, with a broadband home power line network and a low bandwidth inverter power line network, including transmitting the power measurements on the broadband home power line network with a first power line communications device and transmitting the power measurements on the low bandwidth inverter power line network with a second power line communications device.

10. The method of claim 9, wherein the first transmitter is configured to transmit over a WiFi network and the second transmitter is configured to transmit over a cellular network.

11. The method of claim 9, wherein the first transmitter is configured to transmit over a wireless communications link and the second transmitter is configured to transmit over a wired communications link.

12. The method of claim 9, wherein the data communication system is configured to adjust the amount of data transmitted or the frequency of transmission or both based on whether the first transmitter is transmitting or the second transmitter is transmitting.

13. The method of claim 9, comprising performing, by a control circuit, closed or open loop control of one or more devices connected by the data communication system.

14. The method of claim 9, comprising taking, by the measurement circuit, a plurality of consumption measurements from one or more consumption inputs for connecting to a utility line and transmitting, by the data communication system, the consumption measurements to the remote system or a different remote system.

15. The method of claim 9, wherein the data communication system is configured, by virtue of a wireless or wired connection to a networking device, to connect to a local area network and to act as a wireless access point to the local area network.

16. The method of claim 9, wherein the data communication system is configured, by virtue of the data communication system comprising two separate wireless mesh network radios, to simultaneously communicate with a smart meter, a home automation network, and an inverter control system.

* * * * *